United States Patent

Yoshida et al.

[11] Patent Number: 6,165,690
[45] Date of Patent: Dec. 26, 2000

[54] METHOD OF DEVELOPING PHOTOSENSITIVE LITHOGRAPHIC PRINTING PLATE PRECURSOR

[75] Inventors: Susumu Yoshida; Tadao Toyama; Keitaro Aoshima, all of Shizuoka, Japan

[73] Assignee: Fuji Photo Film Co., Ltd., Minami-Ashigara, Japan

[21] Appl. No.: 09/457,482

[22] Filed: Dec. 9, 1999

[30]     Foreign Application Priority Data

Dec. 22, 1998   [JP]   Japan ................................. 10-364950

[51] Int. Cl.⁷ ..................................................... G03D 3/12
[52] U.S. Cl. .......................... 430/302; 396/626; 396/636; 396/641
[58] Field of Search .............. 430/302; 396/626, 396/636, 641

[56]           References Cited

U.S. PATENT DOCUMENTS

| 4,383,751 | 5/1983 | Schoring et al. | 354/322 |
| 5,043,756 | 8/1991 | Takabayashi et al. | 354/320 |
| 5,349,413 | 9/1994 | Olishi et al. | 354/324 |
| 6,004,727 | 12/1999 | Verlinden et al. | 430/302 |
| 6,004,728 | 12/1999 | Deroover et al. | 430/302 |

FOREIGN PATENT DOCUMENTS

| 0050818A1 | 5/1982 | European Pat. Off. . |
| 0095416A1 | 11/1983 | European Pat. Off. . |
| 0947885A1 | 10/1999 | European Pat. Off. . |
| WO 96/20429 | 7/1996 | WIPO . |

OTHER PUBLICATIONS

Patent Abstracts of Japan, vol. 104, No. 11, (P–1014) Feb. 28, 1990 & JP 01 310355A (Fuji Photo Film Co., Ltd.) Dec. 14, 1989 *Abstract*.

*Primary Examiner*—Hoa Van Le
*Attorney, Agent, or Firm*—Burns, Doane, Swecker & Mathis, LLP

[57]            ABSTRACT

A method of development is disclosed, wherein printing plate precursors capable of being exposed with an infrared laser can be developed over a prolonged period without causing image defects, etc. The method comprises conducting the development of a photosensitive lithographic printing plate precursor using an automatic developing apparatus having a substantially closed developing tank in which a developing solution is introduced and a conveying means for conveying the plate precursor disposed within the developing tank.

2 Claims, 1 Drawing Sheet

METHOD OF DEVELOPING PHOTOSENSITIVE LITHOGRAPHIC PRINTING PLATE PRECURSOR

FIELD OF THE INVENTION

The present invention relates to a method of developing a photosensitive lithographic printing plate precursor. More particularly, this invention relates to a method of developing a lithographic printing plate precursor from which a printing plate can be subjected to direct plate-making by exposure with an infrared laser based on digital signals from, e.g., a computer.

BACKGROUND OF THE INVENTION

Attention is recently focused on the plate-making system in which a printing plate is subjected to direct plate-making based on digital data sent from a computer or the like without using a lith film, etc. In recent years, remarkable progress has been made in lasers. In particular, with respect to solid lasers and semiconductor lasers which emit light in from near infrared to infrared regions, compact lasers having a high output have become easily available. These compact lasers are extremely useful as the exposure source of a system for direct plate-making from digital data.

In JP-A-7-285275 (the term "JP-A" as used herein means an "unexamined published Japanese patent application") is proposed an image recording material on which an image can be recorded through exposure with an infrared laser. This recording material is a positive image recording material comprising a binder such as a cresol resin, a substance which absorbs light to generate heat, and a substance which is thermally decomposable and, in its undecomposed state, serves to substantially reduce the solubility of the binder, such as quinonediazide. In this positive image recording material, the substance which generates heat upon light absorption emits heat in exposed areas to thereby make the exposed areas soluble.

In JP-A-7-20625 and Japanese Patent Application No. 10-22404 is described a negative image recording material comprising a compound which decomposes by the action of light or heat to generate an acid, a crosslinking agent which crosslinks with an acid, at least one alkali-soluble resin, and an infrared absorber. In this negative image-recording material, the substance which generates heat upon light absorption emits heat in exposed areas and this heat causes the acid-generating compound to decompose and generate an acid, which in turn accelerates the crosslinking reaction between the crosslinking agent and the alkali-soluble resin. Thus, image recording is conducted.

The image recording materials described above can be used as lithographic printing plate precursors (hereinafter referred to as "plate precursors"). In forming a lithographic printing plate, an image is recorded on a plate precursor by exposure with an infrared laser and the exposed plate precursor is subjected to development optionally after heat treatment.

In general, an automatic developing apparatus is employed for the development of the plate precursors. Widely used automatic developing apparatus is of the type in which a plate precursor image-recorded is conveyed into a developing tank and immersed in a developing solution introduced therein and the photosensitive layer in the non-image areas of the plate precursor is removed with a rubbing means (e.g., a brush roller) disposed in the developing solution.

when the above-described, positive or negative, image recording material, which is capable of image recording through exposure with an infrared laser, is used in forming, e.g., a lithographic printing plate therefrom, there have been cases where the printing plate obtained gives printed matters having image defects e.g., scumming, and image blank spots. Although various attempts have hence been made to overcome the above problem, for example, by changing development conditions in an automatic developing apparatus, they have failed to eliminate such image defects and image blank spots.

There have also been cases where in an automatic developing apparatus, a deposit adheres to the surface of a conveying roller disposed in the space over the developing solution and the deposit scratches the surfaces of plate precursors. An example of such a deposit is a precipitate formed when photosensitive-layer components which have been dissolved in the developing solution separate out as the conveying roller surface wetted with the developing solution dries. The image recording materials, including the positive and negative types, capable of image recording through exposure with an infrared laser have so poor dissolution resistance that even slightly scratched parts of the photosensitive layer surface are dissolved away to leave defects in image areas.

SUMMARY OF THE INVENTION

The present invention has been achieved under the circumstances described above. An object of the present invention is to provide a method of development by which photosensitive lithographic printing plate precursors capable of being exposed with an infrared laser can be developed over a prolonged period without causing image defects, etc.

The present inventors made intensive investigations. As a result, they have found that the positive image recording material capable of image recording through exposure with an infrared laser has a substantial drawback. Since this recording material employs a substrate made of aluminum, heat is easily escaped to the substrate. Namely, when the substance which generates heat upon light absorption emits heat in exposed areas, a part of the heat is absorbed by the aluminum substrate. Consequently, the thermal efficiency is reduced and sufficient solubility cannot be imparted to the exposed areas.

The present inventors have further found that the negative image recording material capable of image recording through exposure with an infrared laser has an additional drawback. Since this recording material employs a substrate made of aluminum, heat is easily escaped to the substrate. Namely, when the substance which generates heat upon light absorption emits heat in exposed areas, a part of the heat is absorbed by the aluminum substrate in this case also. Consequently, a crosslinking reaction cannot be sufficiently accelerated in the exposed areas.

Because of these phenomena, when the positive or negative image recording material is used in forming, for example, a lithographic printing plate, exposure of the recording material with an infrared laser results in unevenness of heating, whereby the resulting printing plate causes image defects and image blank spots.

As a result of further investigations made by the present inventors, they have found that image defects and the like can be considerably diminished by using an automatic developing apparatus in which the developing tank in which a developing solution is introduced has been modified so as to be in a higher degree of a closed state to thereby inhibit the developing solution from being deteriorated by the carbon dioxide present in the air and enable development to be conducted with the always satisfactory developing solution.

As a result, the present inventors have found the following a method.

That is, the present invention is to provide a method of developing a photosensitive lithographic printing plate precursor capable of being exposed with an infrared laser, which comprises conducting the development of the plate precursor using an automatic developing apparatus having a substantially closed developing tank in which a developing solution is introduced and a conveying means for conveying the plate precursor is disposed within the developing tank.

[Description of Symbols]

Figure 1:
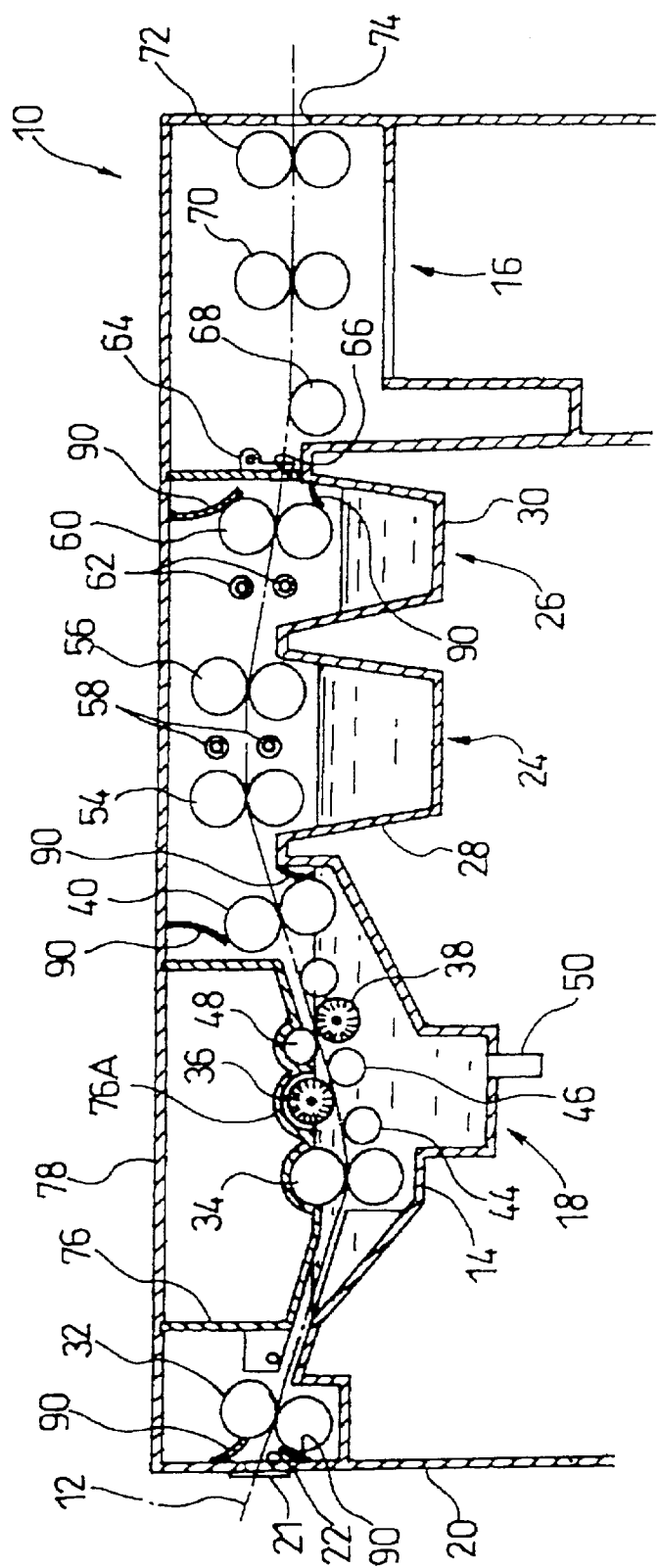
FIG. 1 is a view illustrating a processing apparatus with which the present invention can be practiced.

10 automatic developing apparatus
12 plate precursor (photosensitive lithographic printing plate precursor)
14 developing tank
16 drying part
18 developing part
22 introduction opening
24 water washing part
26 finisher part
28 water washing tank
30 gum solution
32 conveying roller
34 conveying rollers
36, 38 brush roller
40 squeezing rollers
76 shielding lid
78 cover
90 rubber blade The term "substantially closed" as used herein means, for example, a degree of closed state which, in the case of an automatic developing apparatus in which the developing tank or a treatment tank connected thereto has an opening formed in a wall thereof for introducing plate precursors into the tank, can be attained by disposing a means for keeping the opening closed anytime except the introduction of (printing) plate precursors to thereby inhibit air from freely coming into the developing tank. Examples of the substantially closed state further include a degree of closed state which can be attained by disposing a floating lid or the like on the developing solution contained (i.e., introduced) in a developing tank to thereby inhibit the developing solution from contacting the air. A developing tank regulated so as to have an even higher degree of closed state than those can, of course, be used.

The "conveying means" is a device which serves to convey (printing) plate precursors while being in contact therewith. Examples of this conveying means include conveying rollers and the like, in particular, conveying rollers and the like revolved by a driving mechanism.

A preferred developing tank is one in which its inner space over the developing solution is as small as possible. It is preferred to dispose a lid member or the like so that it is adjacent to the surface of the developing solution.

According to the method of development described above, the developing solution can be always kept in a satisfactory state and, hence, the high development processing ability of the automatic developing apparatus can be always maintained. As a result, even when a plate precursor suffers some degree of processing unevenness in exposure, adverse influences of this unevenness on the plate precursor can be eliminated by the development processing.

Furthermore, since a conveying means is disposed within a substantially closed developing tank, the surface of the conveying means is prevented from drying and, hence, adhesion of a deposit on the surface thereof is prevented.

Consequently, the development of (printing) plate precursors capable of being exposed with an infrared laser can be conducted over a prolonged period without causing image defects, etc.

DETAILED DESCRIPTION OF THE INVENTION

Examples of the photosensitive lithographic printing plate precursor to which the method of the present invention can be applied include plate precursors comprising the positive image recording material described in JP-A-7-285275 and plate precursors comprising the negative image recording material described in JP-A-7-20625 or JP-A-11-218903.

The developing solution used in the present invention comprises the following ingredients.

Developing Solution (Alkali agent)

The developing solution and a replenishing solution which are used in the development method of the present invention each is an aqueous alkali solution having a pH of generally from 10.0 to 13.5, preferably from 12.0 to 13.3.

Aqueous alkali solutions conventionally known as developing solutions or replenishing solutions are usable in the present invention. Examples of the alkali include inorganic alkalis such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium borate, potassium borate, ammonium borate, sodium hydroxide, ammonium hydroxide, potassium hydroxide, and lithium hydroxide. Also usable are organic alkalis such as monomethylamine, dimethylamine, trimethylamine, monoethylamine, diethylamine, triethylamine, monoisopropyiamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

Preferred among these alkalis (i.e., alkali agents) are silicates such as sodium silicate and potassium silicate. The reason for this is that an aqueous solution or sich an alkali can be regulated with respect to pH and developing ability by changing the proportion of silicon oxide, $SiO_2$, as a component of the silicate to the alkali metal oxide $M_2O$ (in general, expressed in terms of $[SiO_2]/[M_2O]$ molar ratio) and changing the concentration of the silicate. For example, a preferred aqueous alkali metal silicate solution for use in the present invention is an aqueous sodium silicate solution which has an $SiO_2/Na_2O$ molar ratio of from 1.5 to 2.5 [i.e., $[SiO_2]/[Na_2O]$ is from 1.5 to 2.5] (particularly preferably from 1.6 to 2.2) and an $SiO_2$ content of from 1 to 4% by weight.

Examples of the other preferred alkali solutions include buffer solutions prepared from a weak acid and a strong base. The weak acid used in such buffer solutions is preferably acids having an acid dissociation constant ($pK_a$) of from 10.0 to 13.3, especially from 11.0 to 13.1. For example, sulfosalicylic acid, which has a third dissociation constant of 11.7, can be advantageously used in the present invention. Namely, in the case of a polybasic acid, it can be used in the present invention as long as at least one of its acid dissociation constants is within the above range.

Such weak acids can be selected from those described, e.g., in IONIZATION CONSTANTS OF ORGANIC ACIDS IN AQUEOUS SOLUTION, published by Pergamon Press. Specific examples thereof include alcohols such as 2,2,3,3-tetrafluoropropanol-1 ($pK_a$ 12.74), trifluoroethanol ($pK_a$ 12.37), and trichloroethanol ($pK_a$ 12.24); aldehydes such as pyridine-2-aldehyde ($pK_a$ 12.68) and pyridine-4-aldehyde ($pK_a$ 12.05); saccharides such as sorbitol ($pK_a$ 13.0), saccharose ($pK_a$ 12.7), 2-deoxyribose ($pK_a$ 12.61), 2-deoxyglucose ($pK_a$ 12.51), glucose ($pK_a$ 12.46), galactose ($pK_a$ 12.35), arabinose ($pK_a$ 12.34), xylose ($pK_a$ 12.29), fructose ($pK_a$ 12.27), ribose ($pK_a$ 12.22), mannose ($pK_a$ 12.08), and L-ascorbic acid ($pK_a$ 11.34); compounds having one or more phenolic hydroxyl groups, such as salicylic acid ($pK_a$ 13.0), 3-hydroxy-2-naphthoic acid ($pK_a$ 12.84), catechol ($pK_a$ 12.6), gallic acicl ($pK_a$ 12.4), sulfosalicylic acid ($pK_a$ 11.7), 3,4-dihydroxybenzenesulfonic acid ($pK_a$ 12.2), 3,4-dihydroxybenzoic acid ($pK_a$ 11.94), 1,2,4-trihydroxybenzene ($pK_a$ 11.82), hydroquinone ($pK_a$ 11.56), pyrogallol ($pK_a$ 11.34), and resorcinol ($pK_a$ 11.27); oximes such as 2-butanone oxime ($pK_a$ 12.45), acetone oxime ($pK_a$ 12.42), 1,2-cycloheptanedione dioxime ($pK_a$ 12.3), 2-hydroxybenzaldehyde oxime ($pK_a$ 12.10), dimethylglyoxime ($pK_a$ 11.9), ethanediamide dioxime ($pK_a$ 11.37), and acetophenone oxime ($pK_a$ 11.35); amino acids such as 2-quinolone ($pK_a$ 11.76), 2-pyridone ($pK_a$ 11.65), 4-quinolone ($pK_a$ 11.28), 4-pyridone ($pK_a$ 11.12), 5-aminovaleric acid ($pK_a$ 10.77), 2-mercaptoquinoline ($pK_a$ 10.25), and 3-aminopropionic acid ($pK_a$ 10.24); substances related to nucleic acids, such as fluorouracil ($pK_a$ 13.0), guanosine ($pK_a$ 12.6), uridine ($pK_a$ 12.6), adenosine ($pK_a$ 12.56), inosine ($pK_a$ 12.5), guanine ($pK_a$ 12.3), cytidine ($pK_a$ 12.2), cytosine ($pK_a$ 12.2), topoxanthine ($pK_a$ 12.1), and xanthine ($pK_a$ 11.9); and weak acids such as diethylaminomethylphosphonic acid ($pK_a$ 12.32), 1-amino-3,3,3-trifluorobenzoic acid ($pK_a$ 12.29), isopropylidenediphosphonic acid ($pK_a$ 12.10), 1,1-ethylidenediphosphonic acid ($pK_a$ 11.54), 1-hydroxy-1,1-ethylidenediphosphonic acid ($pK_a$ 11.52), benzimidazole ($pK_a$ 12.86), thiobenzamide ($pK_a$ 12.8), picolinethioamide ($pK_a$ 12.55), and barbituric acid ($pK_a$ 12.5).

Examples of the strong base to be used in combination with these weak acids include sodium hydroxide, ammonium hydroxide, potassium hydroxide, and lithium hydroxide.

These alkalis (i.e., alkali agents) may be used alone or in combination of two or more thereof.

Preferred among those alkaline buffer solutions are those prepared from a combination of sulfosalicylic acid, salicylic acid, saccharose, or sorbitol with sodium hydroxide or potassium hydroxide. An especially preferred combination among these is sorbitol with potassium or sodium hydroxide.

An aqueous solution of any of the various alkalis enumerated above is regulated so as to have a pH in the preferred range by selecting a suitable concentration and combination.

ps (Surfactant)

Various surfactants and organic solvents may be added to the developing solution and replenishing solution for use in the present invention for the purposes of accelerating the developing property, enhancing dispersibility of the tailings resulting from development, and enhancing the ink receptivity of printing plate image areas. Preferred surfactants include anionic, cationic, nonionic, and amphoteric surfactants.

Preferred examples of the surfactants include nonionic surfactants such as polyoxyethylene alkyl ethers, polyoxyethylene alkylphenyl ethers, polyoxyethylene polystyrylphenyl ethers, polyoxyethylene-polyoxypropylene alkyl ethers, glycerol/fatty acid partial esters, sorbitan/fatty acid partial esters, pentaerythritol/fatty acid partial esters, propylene glycol/fatty acid monoesters, sucrose/fatty acid partial esters, polyoxyethylene-sorbitan/fatty acid partial esters, polyoxyethylene-sorbitol/fatty acid partial esters, polyethylene glycol/fatty acid esters, polyglycerol/fatty acid partial esters, polyoxyethylene/castor oil compounds, polyoxyethylene-glycerol/fatty acid partial esters, fatty acid diethanolamides, N,N-bis-2-hydroxyalkylamines, polyoxyethylene alkylamines, triethanolamine/fatty acid esters, and trialkylamine oxides; anionic surfactants such as fatty acid salts, abietic acid salts, hydroxyalkanesulfonic acid salts, alkanesulfonic acid salts, dialkylsulfosuccinic acid ester salts, (linear alkyl)benzenesulfonic acid salts, (branched alkyl)benzenesulfonic acid salts, alkylnaphthalenesulfonic acid salts, alkylphenoxypolyoxyethylenepropylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfonated beef tallow oil, sulfuric acid salts of fatty acid alkyl esters, alkylsulfuric acid ester salts, polyoxyethylene alkyl ether sulfate salts, fatty acid monoglyceride sulfate salts, polyoxyethylene alkylphenyl ether sulfate salts, polyoxyethylene styrylphenyl ether sulfate salts, alkylphosphoric acid ester salts, polyoxyethylene alkyl ether phosphate salts, polyoxyethylene alkylphenyl ether phosphate salts, partially saponified styrene/maleic anhydride copolymers, partially saponified olefin/maleic anhydride copolymers, and naphthalenesulfonic acid salt/formalin condensates; cationic surfactants such as alkylamine salts, quaternary ammonium salts such as tetrabutylammonium bromide, polyoxyethylene alkylamine salts, and polyethylene polyamine derivatives; and amphoteric surfactants such as carboxybetaines, aminocarboxylic acids, sulfobetaines, aminosulfuric acid esters, and imidazoline acids. In the surfactants enumerated above, the "polyoxyethylene" can be replaced with a polyoxyalkylene such as, e.g., polyoxymethylene, polyoxypropylene, or polyoxybutylene. Such surfactants also are included in the examples of the surfactants usable in the present invention.

More preferred surfactants are fluorochemical surfactants having a perfluoroalkyl group in the molecule. Examples of such fluorochemical surfactants include anionic compounds such as perfluoroalkylcarboxylic acid salts, perfluoroalkylsulfonic acid salts, and perfluoroalkylphosphoric acid esters; amphoteric compounds such as perfluoroalkylbetaines; cationic compounds such as perfluoroalkyltrimethylammonium salts; and nonionic compounds such as perfluoroalkylamine oxides, perfluoroalkyl/ethylene oxide adducts, oligomers containing a perfluoroalkyl group and a hydrophilic group, oligomers containing a perfluoroalkyl group and an oleophilic group, oligomers containing a perfluoroalkyl group, a hydrophilic group, and an oleophilic group, and urethanes containing a perfluoroalkyl group and an oleophilic group.

These surfactants can be used alone or in combination of two or more thereof. They are added in an amount of generally from 0.001 to 10% by weight, preferably from 0.01 to 5% by weight, based on the developing solution.

(Development Stabilizer)

Various development stabilizers are used in the developing solution and replenishing solution for use in the present invention. Preferred examples thereof include the sugar-alcohol/polyethylene glycol adducts, tetraalkylammonium salts such as tetrabutylammonium hydroxide, phosphonium salts such as tetrabutylphosphonium bromide, and iodonium salts such as diphenyliodonium chloride, as described in JP-A-6-282079.

Examples thereof further include the anionic or amphoteric surfactants described in JP-A-50-51324, the water-soluble cationic polymers described in JP-A-55-95946, and the water-soluble amphoteric polyelectrolytes described in JP-A-56-142528.

Other examples of the development stabilizers include the organoboron compound/alkylene glycol adducts described in JP-A-59-84241, the water-soluble polyoxyethylene/polyoxypropylene block polymer surfactants described in JP-A-60-111246, the alkylenediamine compounds substituted with polyoxyethylene-polyoxypropylene described in JP-A-60-129750, the polyethylene glycols having a weight-average molecular weight of 300 or higher described in JP-A-61-215554, the fluorochemical surfactants having a cationic group described in JP-A-65-175858, the water-soluble ethylene oxide adduct compounds obtained by the addithon of 4 mol or more of ethylene oxide to 1 mol of an acid or alcohol described in JP-A-2-39157, and the water-soluble polyalkylene compounds described in the same reference.

(Organic Solvent)

If desired, an organic solvent is added to the developing solution and the replenishing solution. A suitable organic solvent is one having a solubility in water of about 10% by weight or lower. Preferably, it is selected from solvents having a solubility in water of 5% by weight or lower. Examples thereof include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-merhylcyclohexanol, 3-methylcyclohexanol, 4-methylcyclohexanol, N-phenylethanolamine, and N-phenyldiethanolamine. The content of such an organic solvent in the developing or replenishing solution to be used is from 0.1 to 5% by weight (preferably from 0.5 to 4% by weight) based on the total amount of the solution. The amount thereof has a close relationship with that of a surfactant. It is preferred to increase the amount of a surfactant as the amount of an organic solvent increases. This is because if a large amount of an organic solvent is used in combination with a small amount of a surfactant, the organic solvent partially remains undissolved and, hence, a satisfactory developing property cannot be expected.

(Reducing Agent)

A reducing agent is further added to the developing solution and replenishing solution for use in the present invention. This is intended to prevent sucmming (i.e., staining of) printing plate fouling, and is effective especially when the printing plate precursor to be developed is a negative photosensitive lithographic printing plate precursor containing a photosensitive diazonium salt compound. Preferred examples of organic reducing agents include phenol compounds such as thiosalicylic acid, hydroquinone, metol, methoxyquinone, resorcin, and 2-methylresorcin and amine compounds such as phenylenediamine and phenylhydrazine. Preferred examples of inorganic reducing agents include the sodium, potassium, and ammonium salts of inorganic acids such as sulfurous acid, hydrogensulfurous acid, phosphorous acid, hydrogenphosphorous acid, dihydrogenphosphorous acid, thiosulfuric acid, and dithious acid. Of these reducing agents, the sulfurous acid salts are especially superior in antisucumming effect. These reducing agents are incorporated in an amount of preferably from 0.05 to 5% by weight (more preferably 0.1 to 4% by weight) based on the developing solution being used.

(Organic Carboxylic Acid)

An organic carboxylic acid may be added to the developing solution and replenishing solution for use in the present invention. Preferred organic carboxylic acids are aliphatic and aromatic carboxylic acids having 6 to 20 carbon atoms. Examples of the aliphatic carboxylic acids include caproic acid, enanthylic acid, caprylic acid, lauric acid, myristic acid, palmitic acid, and stearic acid. Especially preferred of these are the alkanoic acids having 8 to 12 carbon atoms. Unsaturated fatty acids having a double bond in the carbon chain or branched fatty acids may also be used.

Examples of the aromatic carboxylic acids include compounds in which the carboxyl group is substituted to a benzene, naphthalene, or anthracene ring. Specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid. Especially effective among these are the hydroxynaphthoic acids.

The aliphatic and aromatic carboxylic acids enumerated above each is preferably used as the sodium, potassium, or ammonium salt so as to have enhanced solubility in water. The content of an organic carboxylic acid in the developing solution for use in the present invention is not particularly limited. However, contents thereof lower than 0.1% by weight result in an insufficient effect, while contents thereof exceeding 10% by weight are disadvantageous in that not only the effect of the addition thereof is not heightened any more but the acid added may inhibit the dissolution of other additives used in combination therewith. Consequently, the addition amount thereof is preferably from 0.1 to 10% by weight, more preferably from 0.5 to 4% by weight, based on the developing solution being used.

(Other Components)

An antifoamer, a hard water softener, and the like may be incorporated if desired into the developing solution and replenishing solution for use in the present invention. Examples of the hard water softener include polyphosphoric acids and the sodium, potassium, and ammonium salts thereof; aminopolycarboxylic acids such as ethylenediaminetetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, and 1,3-diamino-2-propanoltetraacetic acid and the sodium, potassium, and ammonium salts thereof; and aminotri (methylenephosphonic acid), ethylenediaminetetra (methylenephosphonic acid), diethylenetriaminepenta (methylenephosphonic acid), triethylenetetraminehexa (methylenephosphonic acid), hydroxyethylethylenediaminetri(methylenephosphonic acid), and 1-hydroxyethane-1,1-diphosphonic acid and the sodium, potassium, and ammonium salts thereof.

The optimal addition amount of such a hard water softener varies depending on the chelating ability thereof, the hardness of the hard water to be used, and the amount of the hard water. However, the amount of a hard water softener is generally from 0.01 to 5% by weight, preferably from 0.01 to 0.5% by weight, based on the developing solution being used. If the addition amount thereof is smaller than the lower limit, the desired purpose cannot be fully accomplished. If the addition amount thereof exceeds the upper limit, the softener exerts adverse influences on image areas, resulting in image blank spots, etc.

Although the remaining component of the developing solution and replenishing solution is substantially water, various additives known in this art can be incorporated if necessary.

From the standpoint of transportation, it is advantageous that the developing solution and replenishing solution for use in the present invention each be supplied in the form of a concentrated solution having a reduced water content and the concentrated solution be diluted with water just before use. In this case, an appropriate degree of concentration is such that the components suffer neither separation nor precipitation.

By using the above-described developing solution in the present invention, the occurrence of image defects or the like can be inhibited more effectively.

Modes for carrying out the present invention will be explained below by reference to the drawing. In FIG. 1 is shown an automatic developing apparatus with which the present invention can be carried out. This automatic developing apparatus 10 processes a printing plate precursor 12 on which an image has been recorded with an infrared laser-exposing device not shown.

First, the automatic developing apparatus is outlined.

This automatic developing apparatus 10 has a developing part 18, a water washing part 24 in which the plate precursor 12 is washed with water to remove the developing solution adhered to the plate precursor, a finisher part 26 in which the plate precursor 12 which has been washed with water is desensitized by coating with a gum solution, and a drying part 16 in which the plate precursor 12 is dried. The developing part 18 has a developing tank 14, the water washing part 24 has a water washing tank 28, and the finisher part 26 has a gum solution tank 30.

The automatic developing apparatus 10 has a housing panel 20, which on the developing part 18 side has a slit-form introduction opening 22 through which a plate precursor 12 is introduced. Inside the introduction opening 22 are disposed a pair of conveying rollers 32. The conveying rollers function to nip and convey the plate precursor 12 introduced through the introduction opening 22 so as to send the same to the developing tank 14 at a prescribed angle relative to a horizontal direction.

The developing tank 14 is nearly in the shape of an inverted bell, with the upper end being open and a central part of the bottom projecting downward. Within this developing tank 14 are disposed a pair of conveying rollers 34, brush rollers 36 and 38, and a pair of squeezing rollers 40 in this order from the upstream side along the conveyance direction for the plate precursor 12. These conveying rollers 34, brush rollers 36 and 38, and squeezing rollers 40 are revolved by a driving mechanism not shown.

Back-up rollers 44 and 46 are disposed face-to-face on both sides of the brush roller 36. Furthermore, a back-up roller 48 is disposed so as to face the brush roller 38. These back-up rollers 44, 46, and 48 are freely revolvable and no driving force is transmitted thereto.

The developing part 18 further has a pipe 50 connected to the bottom wall thereof. A developing solution placed in the developing tank 14 is circulated and stirred by draining the solution through the pipe 50 and discharging the same into the developing tank 14 through a discharge opening (not shown) formed in a side wall of the developing part 18.

The closed structure of the developing part 18 will be described later.

The water washing part 24, located downstream from the developing part 18, has two pairs of conveying rollers 54 and 56 disposed above the water washing tank 28. These conveying rollers 54 and 56 are supported by the side plates in a revolvable manner, and driving force is transmitted thereto. These rollers thus constitute the conveyance path for the plate precursor 12 sent from the developing part 18.

Furthermore, spray pipes 58 are disposed face-to-face between the two pairs of conveying rollers 54 and 56 so that the ejection openings of each pipe face the conveyance path. Washing water pumped up from a washing water tank not shown is ejected from the spray pipes 58 to wash the front and back sides of the plate precursor 12 with the washing water. The washing water which has been thus used for washing flows into the water washing tank 28.

The finisher part 26, which is a desensitizing part located downstream from the water washing part 24, has a pair of squeezing rollers 60 disposed above the gum solution tank 30. The plate precursor 12 sent from the water washing part 24 with the conveying rollers 56 is led to these squeezing rollers 60.

A pair of spray pipes 62 are disposed upstream from the squeezing rollers 60 respectively on the upper and the lower sides of the conveyance path so that they face to each other and the ejection openings of each pipe face the conveyance path. A gum solution pumped up from the gum solution tank 30 is ejected from the spray pipes 62 and applied to the front and back sides of the plate precursor 12.

The gum solution applied is evenly spread on the plate precursor 12 with the squeezing rollers 60. Thereafter, the plate precursor 12 is led to the drying part 16 through a passageway opening 66, which is opened and closed with a shutter 64. In this drying part 16, the plate precursor 12 is dried while being conveyed with a guide roller 68 and two pairs of skewer rollers 70 and 72. The dried plate precursor 12 is discharged from the automatic developing apparatus 10 through a discharge opening 74.

The conveying rollers and the squeezing rollers may be made of any material which withstands the chemicals used for processing. Preferred examples of the roller material include silicone rubbers, butyl rubber, ethylene/propylene rubbers (EPT, EPDM), acrylonitrile/butadiene rubbers (NBR), styrene/butadiene rubbers (SBR), polybutadiene rubber (BP), and chloroprene rubber (CR).

Such materials usable for constituting the conveying rollers and squeezing rollers preferably contain an antifungal agent or an antibacterial agent. Although generailly known antifungal or antibacterial agents can be used, oreferred examples thereof include thiazole compounds such as 2-(4-thiazolyl)benzimidazole (Hokustar HP, manufactured by Hokko Chemical Industry Co., Ltd.), thiazoline compounds such as Amordene SK-950 (trade name of Daiwa Chemical Industries Ltd.), and other compounds including Vinyzene (trade name of Morton Thiokol, Inc., U.S.A.).

The addition amount of such an antifungal or antibacterial agent is preferably from 0.1 to 5% by weight based on the rubber roller.

The closed structure of the developing part will be explained below.

The developing part 18 has a box-shaped shielding lid 76 supported by supporting members disposed on walls of the developing tank 14. The shielding lid 76 has a bottom wall 76A, which has a section having continuous circular arcs so that the bottom wall does not come into contact with the upper periphery of each of the conveying rollers 34, brush roller 36, and back-up roller 48. Thus, the bottom wall 76A is prevented from interfering with the rollers, etc.

The bottom wall 76A has a width dimension which is almost the same as the inner distance between the side plates constituting part of the developing tank 14 so that the gap between the bottom wall 76A and each of the side plates is sufficiently narrow for preventing the developing solution surface from being exposed. The side walls of the shielding lid 76 extend to a cover 78 with which upper parts of the automatic developing apparatus 10 are covered. The cover 78, for example, has a rectangular groove so that when the shielding lid 76 is attached to the developing tank 14 and the cover 78 is placed thereover, then the groove is engaged with the upper edges of the side walls to thereby completely close the upper part of the developing tank 14. In place of the groove, a ridge (i.e., a convex) part may be formed so that it is engaged with the upper edges of the side walls.

In the constitution described above, the air flow over the developing solution (the air flow from the introduction opening 22 to the discharge opening 74) is completely obstructed with the side walls of the shielding lid 76 and the cover 78. Because of this, the degree of closed state of the developing part 18 is heightened and carbon dioxide is prevented from flowing into the developing part 18 any more. Consequently, the developing solution is inhibited from being deteriorated by carbon dioxide and development can be conducted with the developing solution which is kept always in a satisfactory state.

Furthermore, since the conveying means comprising the conveying rollers 34, brush rollers 36 and 38, and back-up rollers 44, 46, and 48 are disposed within the substantially closed developing tank 18, the surfaces of these conveying means are prevented from drying. Hence, no deposit adheres to those surfaces.

Therefore, the automatic developing apparatus 10 retains its high development processing ability, and plate precursors capable of being exposed with an infrared laser can be developed over a prolonged period without causing image defects, etc.

A replenishing solution is added to the developing solution so that the surface of the developing solution is kept above the bottom wall 76A of the shielding lid 76. As a result, there is no space beneath the bottom wall 76A and air inclusion is avoided.

The automatic developing apparatus 10 further has rubber blades 90 which are in contact with the pair of conveying rollers 32 and the two pairs of squeezing rollers 40 and 60 and extend from one side panel to the other. In addition, the passageway opening 66 has the shutter 64. Therefore, the degree of closed state of the developing part 18 is heightened further, and the deterioration of the developing solution by carbon dioxide and the vaporization of water contained in the developing solution can be inhibited more effectively.

Furthermore, the shielding lid 76 disposed in the developing part 18 serves to reduce the area of those back-side parts of the cover 78 on which dew condensation can occur. Therefore, the shielding lid 76 is effective in eliminating problems, for example, that waterdrops resulting from dew condensation fall onto a plate precursor 12 being conveyed and thus cause processing unevenness in the plate precursor 12, that waterdrops resulting from dew condensation adhere to upper parts of the side panels or to other parts to cause fungal growth, and that when the cover 78 is opened, waterdrops fall to soil the clothes of the worker.

The introduction opening 22 also may be provided with a rubber blade 21 for preventing air from flowing into the developing part 18. Although the shielding lid employed in the constitution described above has the shape of a hollow box, it may be a solid shielding lid or may have any structure as long as it heightens the degree of closed state of the developing tank.

The marked effects of the present invention will be explained below by reference to the following Examples, but the invention should not be construed as being limited thereto.

EXAMPLE 1

[Production of Positive Lithographic Printing Plate Precursor]

A surface of an aluminum plate having a thickness of 0.3 mm (defined in JIS A 1050) was washed and degreased. This surface was subjected to graining with a nylon brush and an aqueous suspension of pumice stone with a particle size of 400-mesh and then washed thoroughly with water. This aluminum plate was etched by immersion in 25% aqueous sodium hydroxide solution at 45° C. for 9 seconds, washed with water, subsequently immersed in 20% nitric acid solution for 20 seconds, and then washed with water. In the above treatment, the amount of aluminum removed from the surface subjected to graining by the etching was about 3 g/m$^2$. Subsequently, this aluminum plate was subjected to DC anodization using 7% sulfuric acid solution as an electrolyte at a current density of 15 A/dm$^2$ to form an oxide film thereon in an amount of 3 g/m$^2$. The anodized aluminum plate was washed with water, dried, subsequently treated with 2.5 wt % aqueous sodium silicate solution at 30° C. for 10 seconds, and then coated with the following undercoating solution. The coated film was dried at 80° C. for 15 seconds to obtain a substrate. The amount of the dried coated film was 15 mg/m$^2$.

| Undercoating Solution | |
|---|---|
| Compound 1 shown by the following formula | 0.3 g |
| Methanol | 100 g |
| Water | 1 g |

Compound 1:

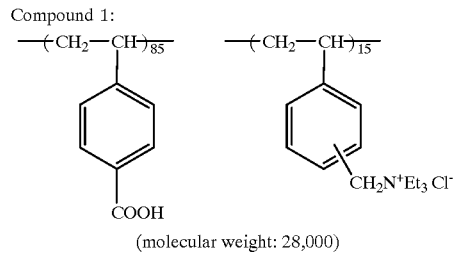

(molecular weight: 28,000)

The substrate obtained was coated with the following photosensitive solution [a] in an amount of 1.1 g/m$^2$ to obtain a positive, infrared-sensitive, lithographic printing plate precursor [A]. This plate precursor was cut into many plates each having a size of 1,003 mm×800 mm.

| Photosensitive Solution [a] | |
|---|---|
| Specific copolymer 1 | 0.75 g |
| m,p-Cresol Novolak (m/p = 6/4; weight-average molecular weight: 3,500; unreacted cresol content: 0.5 wt %) | 0.25 g |
| p-Toluenesulfonic acid | 0.003 g |
| Tetrahydrophthalic anhydride | 0.03 g |

-continued

| Photosensitive Solution [a] | |
| --- | --- |
| Cyanine dye A (having the structure shown below) | 0.017 g |
| Dye obtained by converting the counter ion of Victoria Pure Blue BOH into 1-naphthalene-sulfonic acid anion | 0.015 g |
| Megafac F-177 (fluorochemical surfactant manufactured by Dainippon Ink & Chemicals, Inc.) | 0.05 g |
| γ-Butyrolactone | 10 g |
| Methyl ethyl ketone | 10 g |
| 1-Methoxy-2-propanol | 1 g |

Cyanine Dye A:

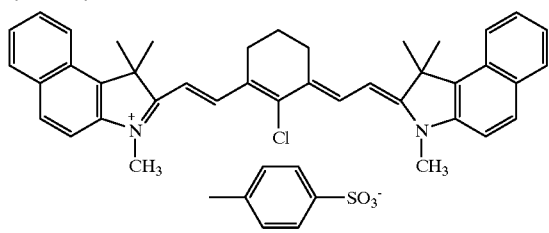

The specific copolymer 1 used in photosensitive solution [a] was obtained by the following procedure.

Into a 500-ml three-necked flask equipped with a stirrer, condenser tube, and dropping funnel were introduced 31.0 g (0.36 mol) of methacrylic acid, 39.1 g (0.36 mol) of ethyl chloroformate, and 200 ml of acetonitrile. The resulting mixture was stirred with cooling in an ice-water bath. To this mixture was dropwise added 36.4 g (0.36 mol) of triethylamine with the dropping funnel over about 1 hour. After completion of the addition, the ice-water bath was removed and the mixture was stirred at room temperature for 30 minutes.

To this reaction mixture was added 51.7 g (0.30 mol) of p-aminobenzenesulfonamide. The resulting mixture was stirred for 1 hour with heating at 70° C. on an oil bath. After completion of the reaction, this reaction mixture was poured into 1 liter of water while stirring the water. The resulting mixture was stirred for 30 minutes and then filtered to obtain a precipitate. This precipitate was added to 500 ml of water to obtain a slurry and the slurry was filtered. The solid obtained was dried to obtain N-(p-aminosulfonylphenyl)methacrylamide as a white solid (yield: 46.9 g).

Subsequently, 4.61 g (0.0192 mol) of the N-(p-aminosulfonylphenyl)methacrylamide, 2.94 g (0.0258 mol) of ethyl methacrylate, 0.80 g (0.015 mol) of acrylonitrile, and 20 g of N,N-dimethylacetamide were introduced into a 200-ml three-necked flask equipped with a stirrer, condenser tube, and dropping funnel. The resulting mixture was stirred with heating at 65° C. on a water bath. To this mixture was added 0.15 g of "V-65" (manufactured by Wako Pure Chemical Industries, Ltd.). The resulting mixture was stirred in a nitrogen stream for 2 hours while keeping it at 65° C. A mixture of 4.61 g of the N-(p-aminosulfonylphenyl)methacrylamide, 2.94 g of ethyl methacrylate, 0.80 g of acrylonitrile, N,N-dimethylacetamide, and 0.15 g of "V-65" was added dropwise to the above reaction mixture with the dropping funnel over 2 hours. After completion of the addition, the resulting mixture was further stirred at 65° C. for 2 hours. After completion of the reaction, 40 g of methanol was added to the mixture, which was cooled and then poured into 2 liters of water while stirring the water. This mixture was stirred for 30 minutes. The resulting precipitate was taken out by filtration and dried to obtain 15 g of a white solid. Thus, the specific copolymer 1 was obtained. The weight-average molecular weight (in terms of standard polystyrene) of this copolymer was measured by gel permeation chromatography, and was found to be 53,000.

The infrared-sensitive lithographic printing plate precursor [A] thus obtained was exposed with a semiconductor laser having an output of 500 mW, a wavelength of 830 nm, and a beam diameter of 17 μm ($1/e^2$) at a main scanning speed of 5 m/sec.

Subsequently, 20 liters of the following developing solution i (pH: about 13) was introduced into the developing tank of the automatic developing apparatus shown in FIG. 1 and was kept at 30° C. Into the second tank of this automatic developing apparatus was introduced 8 liters of tap water. Into the third tank thereof was introduced 8 liters of a finishing gum solution prepared by diluting FP-2W (manufactured by Fuji Photo Film Co., Ltd.) with water in a ratio of 1:1.

| Developing Solution i | |
| --- | --- |
| D-Sorbitol | 2.5 wt % |
| Potassium hydroxide | 1.3 wt % |
| Diethylenetriaminepenta (methylene-phosphonic acid) pentasodium salt | 0.1 wt % |
| Water | 96.1 wt % |

Using this automatic developing apparatus, 50 sheets of the infrared-sensitive lithographic printing plate precursor [A] which had been exposed were processed per day. In this processing, the developing tank was replenished with the following replenishing solution i in amounts of 30 ml per one plate, 250 ml/hr during the operation of the automatic developing apparatus, and 80 ml/hr during the suspension of developing operation. Furthermore, the second tank was replenished with water in an amount of 60 ml per one plate, while the third tank was replenished with the finishing gum solution, consisting of FP-2W and water in a ratio of 1:1, in an amount of 40 ml per one plate.

| Replenishing Solution i | |
| --- | --- |
| D-Sorbitol | 5.6 wt % |
| Potassium hydroxide | 2.5 wt % |
| Diethylenetriaminepenta (methylene-phosphonic acid) pentasodium salt | 0.2 wt % |
| Water | 91.7 wt % |

The lithographic printing plates obtained by the above processing were examined for the width of a standard fine line, (8 μm) As a result, no change in the line width was observed throughout the period of from the initiation of processing to the termination of 1-month processing. Furthermore, the printing plates obtained every day were visually examined for scratching in the image areas. As a result, no scratching was found.

One of the lithographic printing plates obtained was mounted on offset printing press ("Sprint 25" manufactured by KOMORI PRINTING MACHINERY CO., LCD.) to conduct printing. As a result, the printing plate showed satisfactory ink receptivity and the 15th printed matter obtained was a scumming-free beautiful print. The 70,000 printed matters obtained subsequently thereto were also satisfactory.

This automatic developing apparatus thus used for 1-month processing was examined. As a result, the rollers and the like were found to have no deposit which may cause a scratched plate.

EXAMPLE 2

The same substrate as in Example 1 was coated with the following photosensitive solution [b] in an amount of 1.0 g/m² to obtain an infrared-sensitive lithographic printing plate precursor [B].

| Photosensitive Solution [b] | |
|---|---|
| Specific copolymer 1 | 0.4 g |
| m,p-Cresol Novolak (m/p = 6/4; weight-average molecular weight: 3,500; unreacted cresol content: 0.5 wt %) | 0.6 g |
| p-Toluenesulfonic acid | 0.003 g |
| Tetrahydrophthalic anhydride | 0.03 g |
| Cyanine dye B (having the structure shown below) | 0.017 g |
| Dye obtained by converting the counter ion of Ethyl Violet (manufactured by Orient Chemical Industries Ltd.) into 1-naphthalenesulfonic acid anion | 0.015 g |
| Megafac E-177 (fluorochemical surfactant manufactured by Dainippon Ink & Chemicals, Inc.) | 0.05 g |
| γ-Butyrolactone | 10 g |
| Methyl ethyl ketone | 10 g |
| 1-Methoxy-2-propanol | 3 g |

Cyanine dye B:

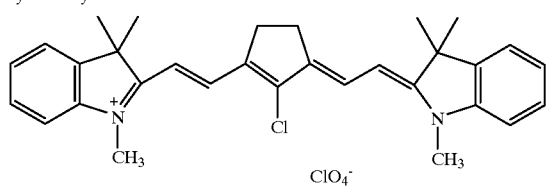

The infrared-sensitive lithographic printing plate precursor [B] thus obtained was subjected to the same exposure and processing as the lithographic printing plate precursor [A] obtained in Example 1.

The lithographic printing plates obtained by the above processing were examined for the width of a standard fine line (8 μm). As a result, no change in the line width was observed throughout the period of from the initiation of processing to the termination of 1-month processing. Furthermore, the printing plates obtained every day were visually examined for scratching in the image areas. As a result, no scratching was found.

One of the lithographic printing plates obtained was mounted on offset printing press ("Sprint 25" manufactured by KOMORI PRINTING MACHINERY CO., LTD.) to conduct printing. As a result, the printing plate showed satisfactory ink receptivity, and the press came to give beautiful printed matters after only 14 sheets had been printed.

EXAMPLE 3

[Production of Negative Lithographic Printing Plate Precursor]

A surface of an aluminum plate having a thickness of 0.3 mm (defined in JIS A1050) was degreased. This surface was grained with a nylon brush and an aqueous suspension of pumice stone with a particle size of 400-mesh and then washed thoroughly with water. This aluminum plate was etched by immersion in 25% aqueous sodium hydroxide solution at 45° C. for 9 seconds, washed with water, subsequently immersed in 2% $HNO_3$ solution for 20 seconds, and then washed with water. In the above treatment, the amount of aluminum removed from the surface subjected to graining by the etching was about 3 g/m². Subsequently, this aluminum plate was subjected to DC anodization using 7% $H_2SO_4$ solution as an electrolyte at a current density of 15 A/dM² to form an oxide film thereon in an amount of 3 g/m². The anodized aluminum plate was washed with water, subsequently dried, and then coated with the following undercoating solution. The coated film was dried at 80° C. for 30 seconds. The amount of the dried coated film was 10 Mg/m².

| Undercoating Solution | |
|---|---|
| 2-Aminoethylphosphonic acid | 0.5 g |
| Methanol | 40 g |
| Pure water | 60 g |

Subsequently, the following solution [n] was prepared and applied to the undercoated aluminum plate. The coated film was dried at 100° C. for 1 minute to obtain a negative lithographic printing plate precursor [N]. The amount of the dried coated film was 1.5 g/m².

| Solution [n] | |
|---|---|
| Marukalinker M H-2P (poly(p-hydroxystryrene) manufactured by Maruzene Petrochemical Co., Ltd.) | 1.4 g |
| Crosslinking agent [KZ-1] | 0.6 g |
| Infrared-absorbing dye [IK-1] | 0.2 g |
| Acid generator [SH-1] | 0.2 g |
| Naphthalenesulfonic acid salt of Victoria Pure Blue | 0.04 g |
| Magafac F-177 (fluorochemical surfactant manufactured by Dainippon Ink & Chemicals, Inc.) | 0.04 g |
| Methyl ethyl ketone | 10 g |
| Methanol | 7 g |
| 1-Methoxy-2-propanol | 10 g |

The crosslinking agent [KZ-1], infrared-absorbing dye [IK-1], and acid generator [SH-1] are respectively represented by the following structural formulae.

KZ-1:

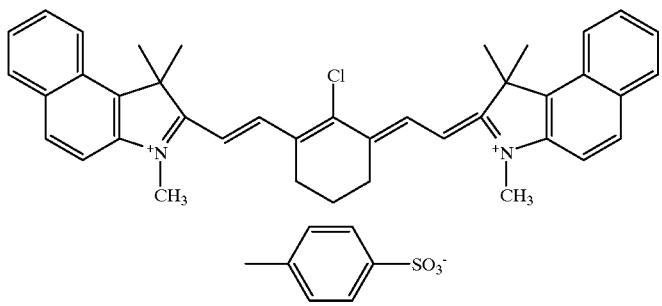

IK-1:

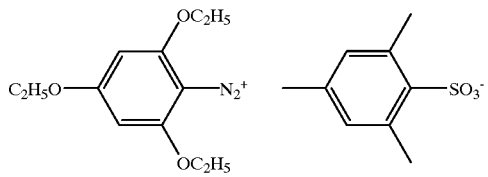

SH-1:

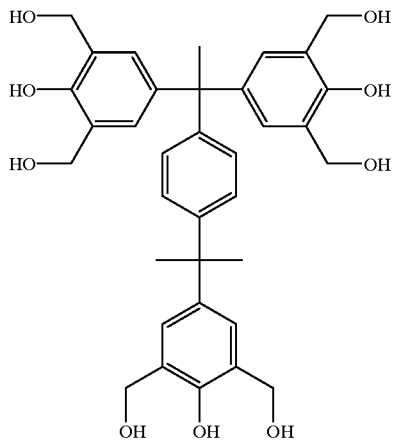

The negative lithographic printing plate precursor [N] obtained was image-wise exposed with infrared laser exposing device (Trendsetter 3244MT, manufactured by Creo Co., Ltd.), at an irradiation energy of 130 mJ/m². After the exposure, the plate precursor was heated at 140° C. for 60 seconds with oven (SPC-MINI, manufactured by Wisconsin Oven Corporation.). Developing solution DP-4 (1:8) (manufactured by Fuji Photo Film Co., Ltd.) was introduced into the closed type automatic developing apparatus and eight plates of the heated plate each having a size of 1,030×800 mm were processed per day for 1 month.

The printing plates obtained every day were visually examined for scratching in the image areas (exposed areas). As a result, no scratching was found. The printing plates had suffered neither development failures nor excessive development, and the one-month processing could be carried out stably. These plates were subjected to printing with a commercial black ink using printing press Lithlon (manufactured by Komori Corporation.). As a result, they could retain a constant impression capacity (100,000 sheets) without causing scumming.

This automatic developing apparatus thus used for 1-month processing was examined. As a result, the rollers and the like were found to have no deposit which may cause a scratched plate.

As described above in detail, according to the method of development of the present invention, the plate precursors capable of being exposed with an infrared laser can be developed over a prolonged period without causing image defects, etc.

While the invention has been described in detail and with reference to specific embodiments thereof, it will be apparent to one skilled in the art that various changes and modifications can be made therein without departing from the spirit and scope thereof.

What is claimed is:

1. A method of developing a photosensitive lithographic printing plate precursor having an aluminum substrate and being capable of being exposed with an infrared laser, which comprises conducting the development of the plate precursor using an automatic developing apparatus having a substantially closed developing tank in which a developing solution is introduced and a conveying means for conveying the plate precursor disposed within the developing tank wherein a lid member which is a box-shaped shielding lid is disposed in the developing tank so that the lid member is adjacent to a surface of the developing solution.

2. The method for developing a photosensitive lithographic printing plate precursor as in claim 1, wherein the box-shaped shielding lid has a bottom wall which has a section having continuous circular arcs which contain rollers.

* * * * *